United States Patent

Moore et al.

[11] Patent Number: 5,826,630
[45] Date of Patent: Oct. 27, 1998

[54] J-LEAD CONDITIONING METHOD AND APPARATUS

[75] Inventors: Troy D. Moore, Garland; Dennis M. Botkin, Seagoville, both of Tex.

[73] Assignee: Semiconductor Technologies & Instruments, Inc., Dallas, Tex.

[21] Appl. No.: 936,860

[22] Filed: Sep. 24, 1997

Related U.S. Application Data

[60] Provisional application No. 60/026,806 Sep. 30, 1996.

[51] Int. Cl.⁶ .................................................. B21F 1/02
[52] U.S. Cl. ............................................................ 140/147
[58] Field of Search ........................................... 140/147

[56] References Cited

U.S. PATENT DOCUMENTS

| | | | |
|---|---|---|---|
| 4,691,747 | 9/1987 | Sokolovsky | 140/147 |
| 4,765,376 | 8/1988 | Leiwe | 140/147 |
| 5,219,404 | 6/1993 | Moore et al. | 140/147 |
| 5,249,239 | 9/1993 | Kida | 382/8 |
| 5,273,081 | 12/1993 | Maksim | 140/105 |
| 5,402,505 | 3/1995 | Roy et al. | 382/8 |
| 5,406,372 | 4/1995 | Vodanovic et al. | 356/394 |
| 5,477,894 | 12/1995 | Wakabayashi et al. | 140/147 |
| 5,487,416 | 1/1996 | Maksim | 140/105 |

FOREIGN PATENT DOCUMENTS 1-162519 (A)  6/1989  Japan .

*Primary Examiner*—Lowell A. Larson
*Attorney, Agent, or Firm*—Akin, Gump, Strauss, Hauer & Feld, L.L.P.

[57] ABSTRACT

An electronic device package lead conditioning method and system corrects bowed-in J-leads (36) of an electronic device package (30) by inserting between a bowed-in J-lead (36) and electronic device package (36) a comb-like tooth (42) having a graduating-width edge, the graduating width edge graduating from a minimum width (112) to a maximum width (114). The minimum width permits the graduating width edge (112) to be inserted into a space (110) separating the bowed-in J-lead (36) from electronic device package (30). The maximum width (114) at least equals the width of a desired spacing for the bowed-in J-lead (36) from the electronic device package (30) for correcting for the bowed-in-condition of the bowed-in J-lead (36).

12 Claims, 6 Drawing Sheets

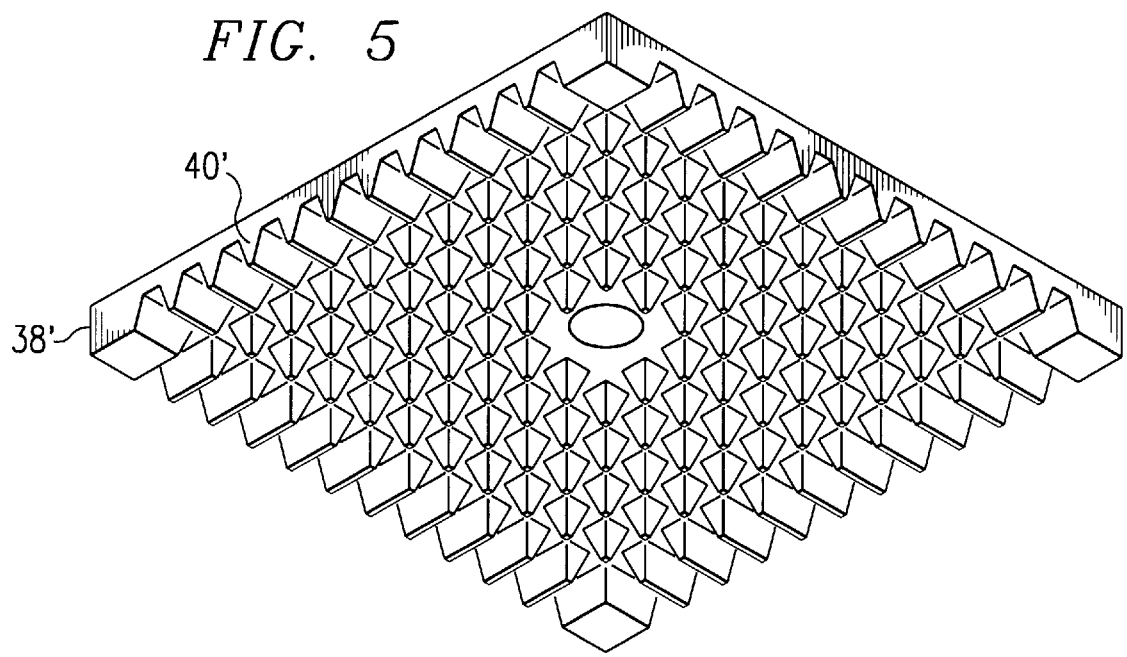
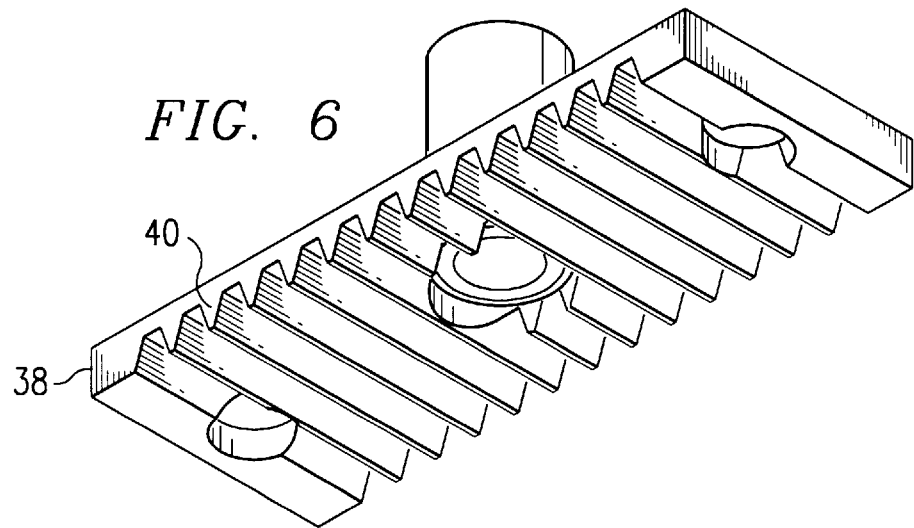

J-LEAD CONDITIONING METHOD AND APPARATUS

This application claims priority under 35 U.S.C. §119(e)(1) of Provisional Application No. 60/026,806, filed Sep. 30, 1996.

TECHNICAL FIELD OF THE INVENTION

The present invention relates to a system and method for processing electronic devices and, more particularly, to a lead conditioning system for properly adjusting electronic component package leads, and even more particularly, the present invention relates to a method and system for correcting bowed-in J-leads of an electronic device package.

BACKGROUND OF THE INVENTION

Unintended deformation of electronic component package leads, such as electronic component package J-leads, is a well-known problem in the electronics industry. In the case of J-leads, this problem has been dealt with by manually manipulating the J-leads back into their correct shape when deformation occurs. The problem with this method, however, is that as electronic component package processing is becoming more automated, manual manipulation becomes comparatively less efficient. Manual working and handling of electronic component packages for J-lead conditioning, therefore, is becoming less desirable.

There also are systems that correct automatically for J-lead bow-in. For example, some systems attempt to correct bow-in by pushing the tail end of the J-lead out away from the electronic package center. While this type of system works well for many instances of bow-in, it often yields inconsistent results.

Consistent results are desired in J-lead bow-in connection for a number of reasons. For example, it may be desirable for a lead to have a high degree of flexibility to accommodate wide temperature ranges within which the electronic device may separate. Because the bow-in condition limits flexibility, a J-lead solder joint could break during the extreme temperatures that the component may experience. If a solder-joint breaks, the J-lead could move. This has the potential of placing an existing over coating material between the lead and the underlying connection pad, resulting in an open circuit at the J-lead.

SUMMARY OF THE INVENTION

There is a need for a lead conditioning system that effectively corrects for a bowed-in lead condition on a J-lead equipped electronic device package.

In accordance with the present invention, a J-lead conditioning system is provided that substantially eliminates or reduces disadvantages and problems associated with previously developed lead conditioning systems that either cannot correct for bowed-in J-leads or that inefficiently perform bowed-in J-lead conditioning.

More specifically, the present invention provides a J-lead conditioning system for conditioning bowed-in J-leads of an electronic component package. The present invention includes a comb-toothed device that inserts between a bowed-in lead and the electronic device package. The comb-toothed device includes graduating thickness comb-like teeth, each of which includes a beginning edge of a minimum thickness that graduates from the minimum thickness to a maximum thickness. The minimum thickness comb-like teeth can be inserted alongside a bowed-in J-lead and into the space separating the bowed-in J-lead from the remainder of the electronic device package. The maximum thickness at least equals the desired clearance of the bowed-in J-lead from the electronic device package. The comb-like teeth engage the bowed-in lead with the graduating width edge of the tool to move the bowed-in lead from a bowed-in position to a desired aligned position.

A technical advantage of the present invention is its ability to be used with pre-existing systems and as only a single additional step of a process for otherwise conditioning the electronic device J-leads. This makes using the present invention only consume a minimal additional time in correcting for bowed-in J-leads.

Another technical advantage of the present invention is that, while it conditions bowed-in J-leads of an electronic device package, it does not inadvertently affect properly positioned and aligned J-leads.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein:

FIG. 5 is a partial, elevational view of a centering device of a four-side embodiment of the present offset conditioner station;

FIG. 6 is a partial, elevational view of a centering device of a two-side embodiment of the present offset conditioner station;

DETAILED DESCRIPTION OF THE INVENTION

Preferred embodiments of the present invention are illustrated in the FIGUREs like numerals being used to refer to like and corresponding parts of the various drawings.

Figure 1:
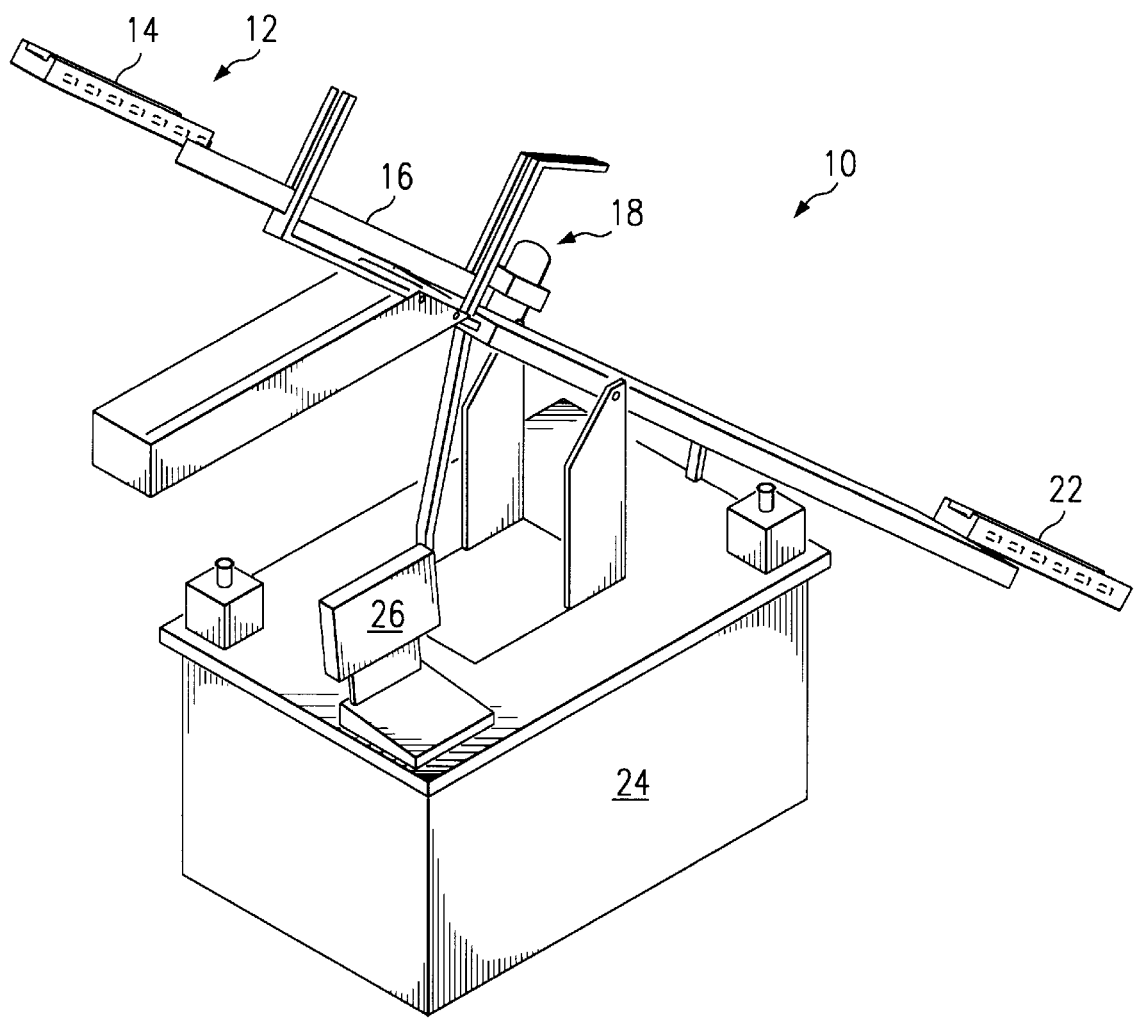
FIG. 1 illustrates one embodiment of a lead conditioning system for using the present invention to correct bowed-in J-leads of an electronic device package.

FIG. 1 illustrates one embodiment of a lead conditioning system for using the present invention to correct bowed-in J-leads of an electronic device package. Lead conditioning system 10 that provides feed mechanism 12 for feeding numerous electronic device packages that tube 14 holds. In operation, electronic device packages pass from tube 14 along rail 16 where bowed-in J-lead conditioning device 18, which takes the form of one of the various embodiments here described, corrects for bowed-in J-leads. Tube 22 receives the conditioned electronic device packages that after passing through J-lead conditioning device 18 have corrections for both bowed-in J-leads and for other defects. Cabinet 24 holds electrical circuitry to support the operation of lead conditioning system 10. Cabinet 24 is conventional in nature and serves as the primary housing for lead conditioning system 10. Control panel 26 permits the control of lead conditioning system 10.

Two lead conditioning systems that can effectively accommodate the present embodiment of the invention are the Texas Instruments AT4140 and AT4160 PLCC Lead Conditioning Systems. Both of these systems provide a fully automatic system for correcting bent lead, lead sweep, lead pitch, and package stand-off problems for PLCC products. The AT4140 is a gravity fed lead conditioning system as appearing in FIG. 1. The AT4160, on the other hand, is a "pick and place" machine that includes a mechanical apparatus for moving the electronic device packages both before and after correction.

Although not shown in FIG. 1, lead conditioning system 10, may have various differing devices that appear along rail 16 for sequentially performing different lead conditioning operations. In the event that the other lead conditioning operations are to be performed, the present invention may be employed as only one additional step in the J-lead conditioning process-the other steps occurring, as appropriate, before and after correction for the bowed-in condition.

Figure 2:
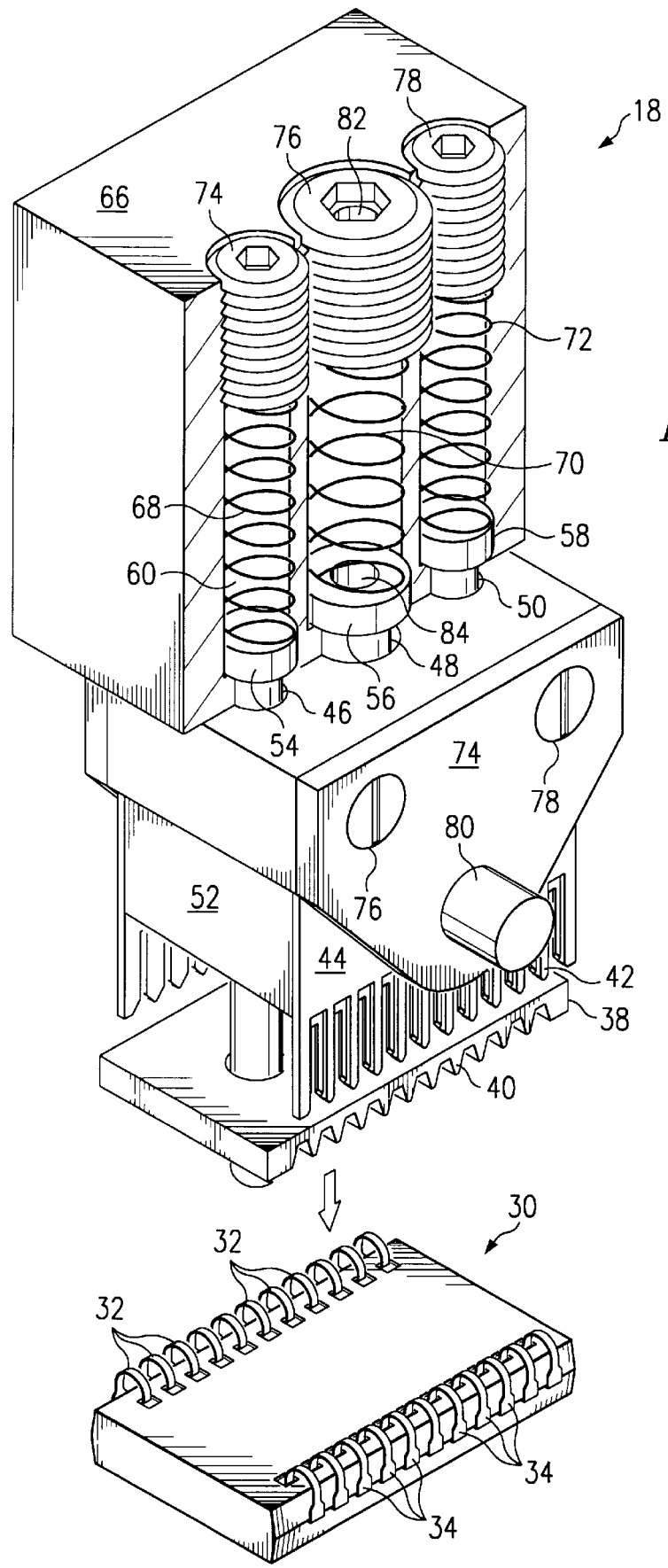
FIG. 2 is a partial, cross-sectional cut-away view of a bowed-in lead conditioning system of the present invention.

FIG. 2 is a partially cut-away view of a bowed-in lead conditioning device 18 of the present lead conditioning system. FIG. 2 shows electronic device package 30 that includes J-lead-sets 32 and 34. Notice that J-lead 36 is bowed-in. This means that J-lead 36 has been compressed or otherwise deformed to be closer to the side of electronic package 30 than its design specifies. J-lead conditioning, device, when used with lead conditioning system 10 or a similar system, corrects this problem without adversely affecting or threatening to affect other J-leads which may be not bowed-in.

J-lead conditioning device 18 includes J-lead centering device 38 that first contacts electronic device package 30. Teeth 40 of J-lead alignment plate 38 position J-lead conditioning device 18 so that comb-like teeth 42 of comb-toothed device 44 may engage electronic device package 30 alongside the J-lead and into the space separating the J-leads from the side wall of the electronic device package.

Three alignment rods 46, 48, and 50 pass through middle block section 52 to hold alignment plate 38 in place. Alignment rods 46, 48, and 50 include heads 54, 56, and 58 respectively that respective channels 60, 62, and 64 of upper-block section 66 hold. Springs 68, 70, and 72 respectively, apply spring pressure to alignment rods 46, 48 and 50. Screws 74, 76, and 78 hold respective springs 68, 70, and 72 in place and, via screw threads may vary their position. This permits adjusting the compression and, therefore, the pressure extended by springs 68, 70, and 72. Note that alignment rod 48 and its associated channel 63, head 56, spring 70 and screw 76 are of greater dimensions than the other alignment rods and associated components. This may allow, for example, a vacuum channel 82 to exist in screw 76 and channel 84 to exist in alignment rod 48. Vacuum channels 82 and 84 may permit a vacuum draw to pass through alignment rod 48 and through alignment plate 40, to hold an electronic device package firmly against alignment plate 40 using vacuum force. While the preferred embodiment does not use such vacuum channels, they are possible and fully within the scope of the present invention.

Middle block section 52 holds comb-tooth device 44 using block plate 74. Screws 76 and 78 and swivel pin 80 hold comb-tooth device 44 in place. One such block plate 74 retains a comb-toothed device 44 to middle block section 52 for each side of the device.

Figure 3:
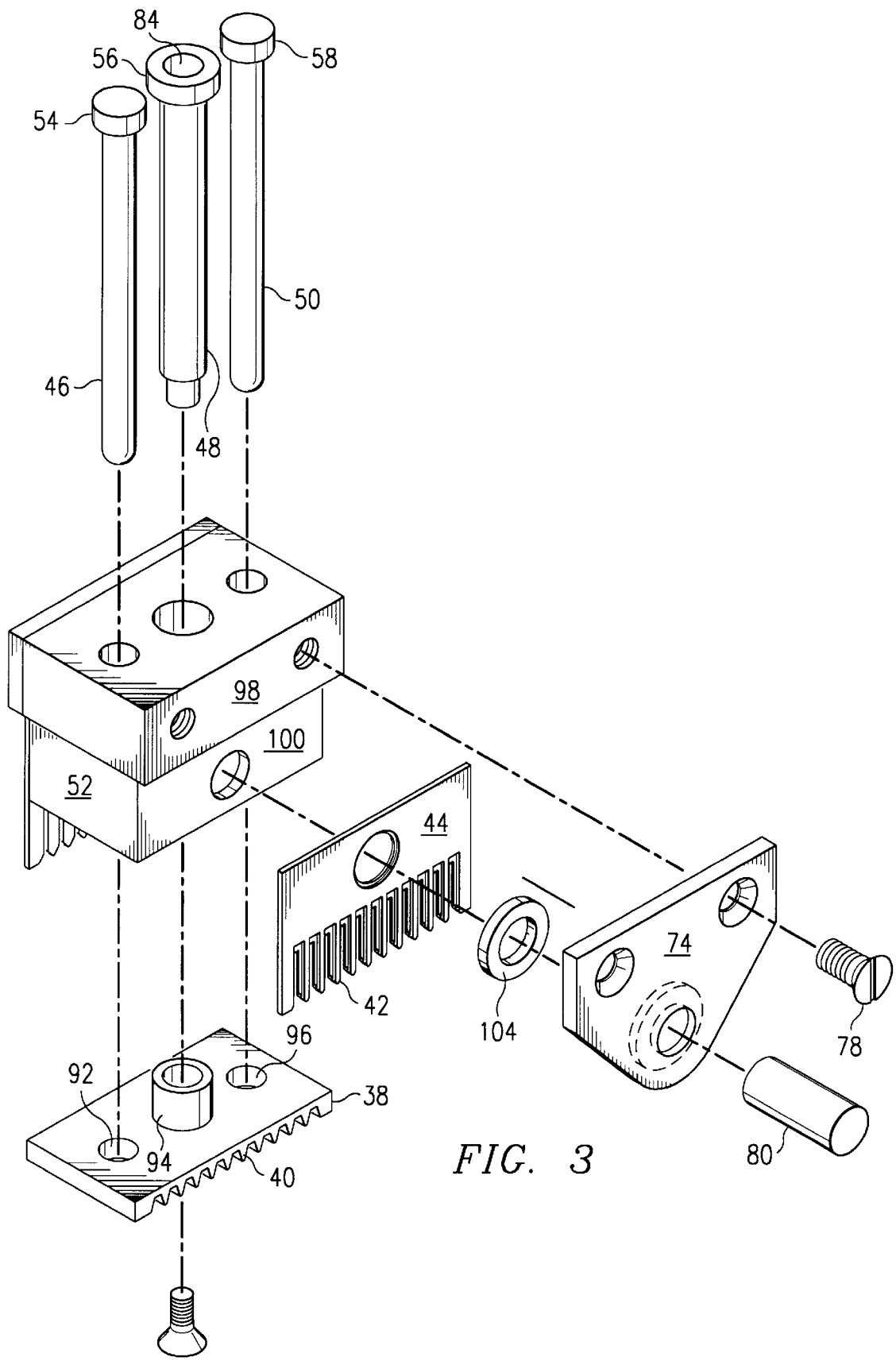
FIG. 3 is an exploded view of a two-side embodiment of the present invention.

FIG. 3 is an exploded view of the middle block portion 52 for a two-sided embodiment of the present invention. At the top of middle block portion 52 holes 86, 88 and 90 that slidably receive pins 46, 48 and 50 respectively. Pins 46, 48 and 50 pass through middle block portion 52 to engage holes 92, 94, and 96 respectively.

FIG. 3 also demonstrates how plate 74 secures combtoothed alignment device 44 in position along middle block portion 52. Plate 74 fastens via screws 76 (not shown) and 78 to upper ledge 98 of middle block portion 52. Comb-toothed alignment device 44 fits beneath upper ledge 98 and is secured to lower segment 100 by swivel pin 80 that passes through the second plate 74 and rubber bushing 104. An equivalent structure appears on the opposite side of middle block portion 52. Rubber bushing 104 holds comb-toothed device 44 secure, while permitting a slight degree of motion. This allows for variation in package width and positions.

Figure 4A:
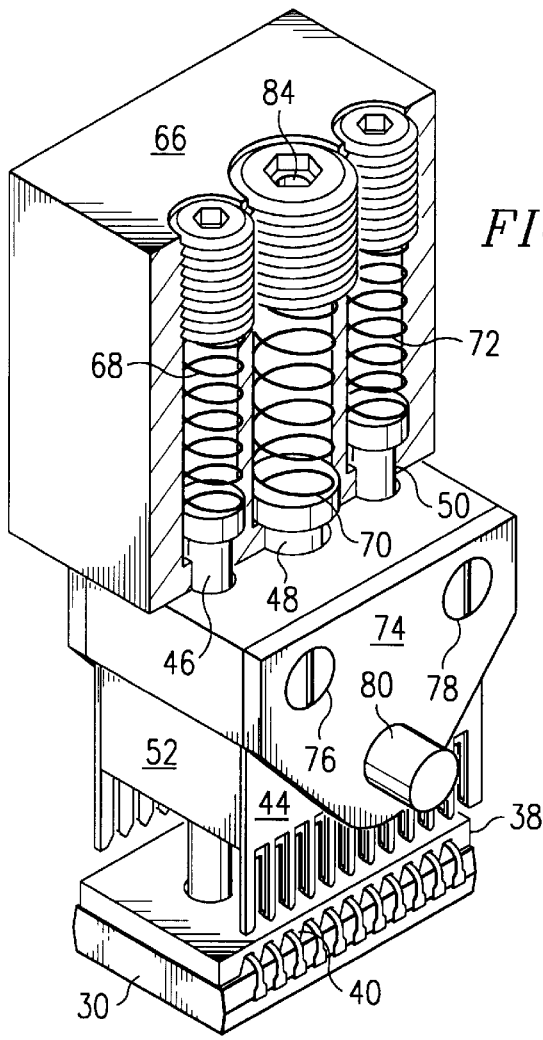
FIGS. 4A and 4B illustrate the centering and engagement operations of the bowed-in lead conditioning device of FIGS. 2 and 3.
Figure 4B:
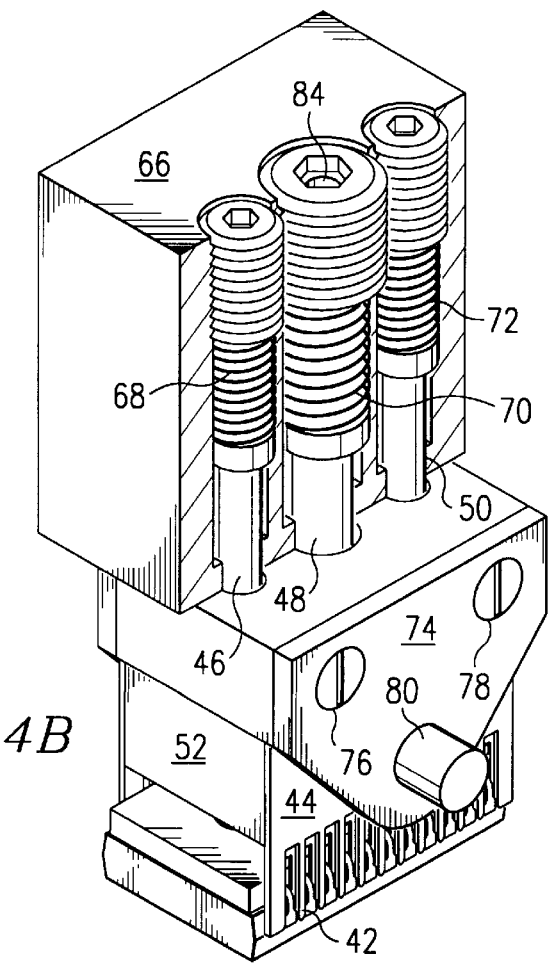

FIGS. 4A and 4B show operation of the present embodiment for first positioning electronic device package 30 J-leads in proper position with respect to bowed-in-J-lead conditioning device 18 and then engaging the J-leads with comb-teeth 42 of comb-toothed alignment device 44. Thus, as FIG. 4A first shows, alignment teeth 40 of alignment plate 38 fit between J-leads 32 of electronic device package 30. Alignment teeth 40 have a pointed edge and wide base to accommodate a large degree of error in the original positioning of the electronic device package.

In other words, the present invention uses a wedging action that comb-toothed alignment device 44 causes and the movement of comb-toothed alignment device 44 follows the profile of electronic device package 30 to provide a consistent clearance between the J-lead and electronic device package 30. Note that alignment plate 38 prevents damage to the J-leads, but is not essential for practicing the present invention. After engagement of alignment plate 38, however, what may have been a large error has been essentially eliminated. This permits the second stages of the bowed-in J-lead conditioning process.

FIG. 4B shows this next stage in which comb-teeth 42 of comb-tooth alignment device 44 insert between J-leads 32. Note that without the initial alignment stage of FIG. 4B, comb-teeth 42 possibly could hit one or more J-leads to either damage comb-toothed alignment device 44, the J-lead, or both.

FIGS. 5 and 6 show the bottom sides of two embodiments of alignment plate 38 of the present invention. In FIG. 5, alignment plate 38 is useful for aligning an electronic device package having J-leads on all four of its sides. The FIG. 6 device is for the two-sided J-lead electronic device package such as that appearing in FIGS. 1 through 4.

Figure 7A:
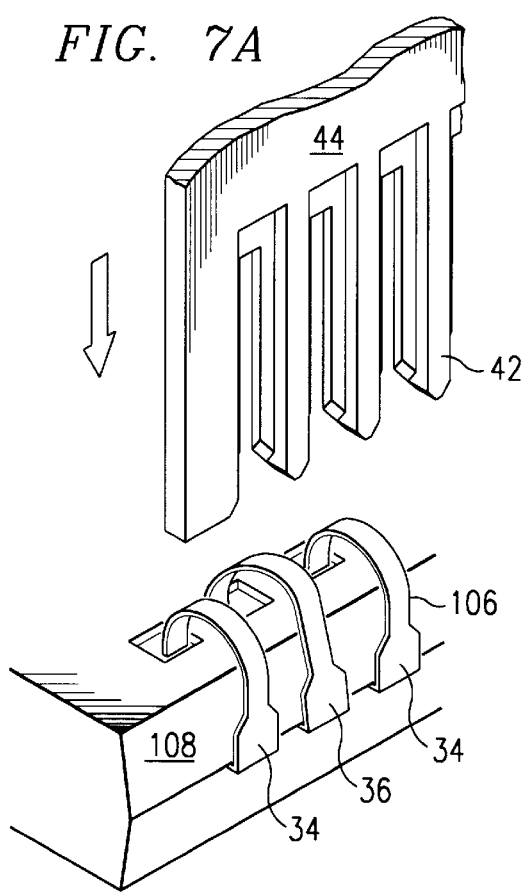
FIGS. 7A through 7D illustrate the process of using the present invention for correcting a bowed-in J-lead condition of an electronic device package.
Figure 7B:
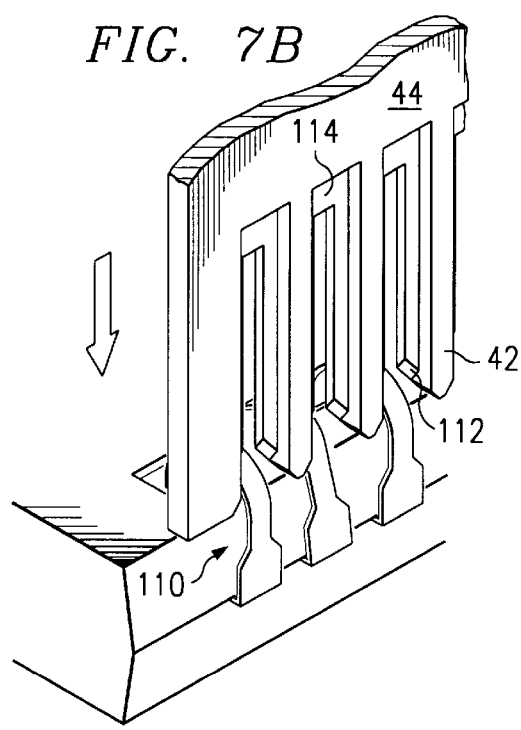

FIGS. 7A through 7D show operation of the present embodiment for correcting a bowed-in J-lead condition. In FIG. 7A, comb-toothed alignment device 44 moves in a downward direction to engage J-leads 32, 34 and 36 of electronic device package 30. Notice that J-lead 36 is bowed-in, having been for some reason or another, pushed inward to create less than an optimal distance between stem 106 and side wall 108. FIG. 7B shows the downward motion of teeth 42 in space 110 that separates adjacent J-leads. Although not shown in FIGS. 7A through 7D, alignment plate 38 would have initially aligned J-leads 32, 34, and 36 to permit proper initial insertion into space 110.

Each of the comb teeth 42 includes a minimum thickness edge 112 that permits insertion to space 110. This is true even for the instance of a bowed-in J-lead. Each of the comb-like teeth 42 also is preferably more narrow at the tip that inserts between adjacent J-leads. This even further accommodates for initial misalignment between combtoothed alignment device 44 and J-leads 32, 34 and 36.

Figure 7C:
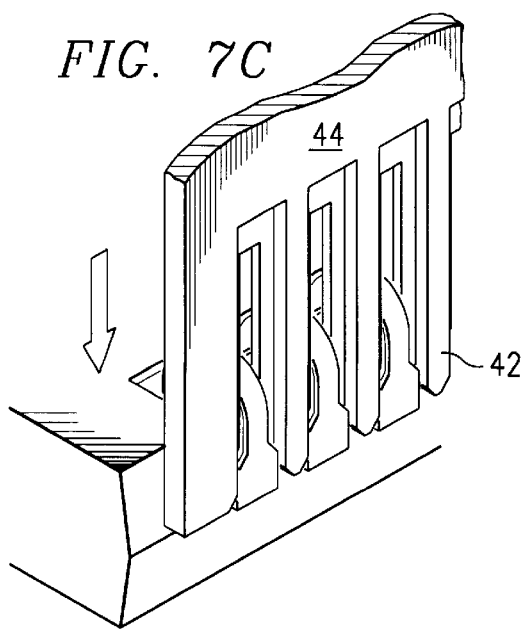
Figure 7D:
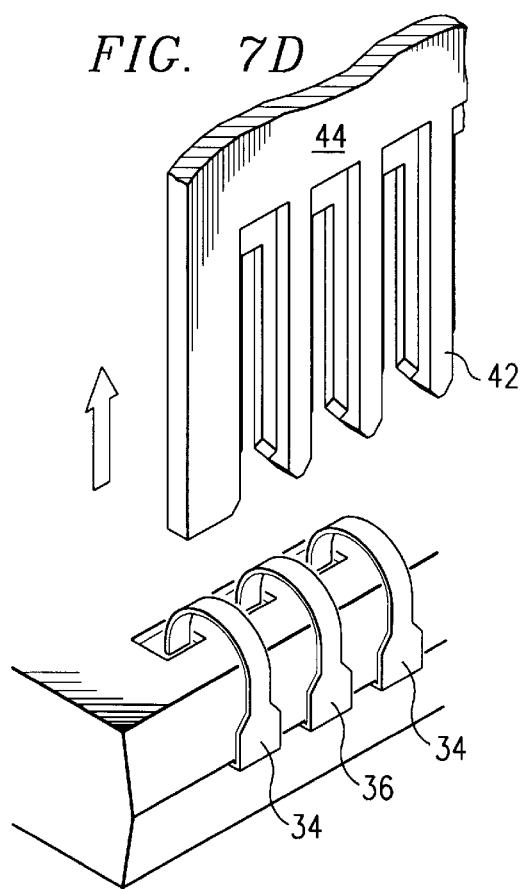

Once the minimum thickness of comb-toothed alignment device 44 inserts between the bowed-in J-lead and the electronic device package, comb-toothed alignment device 44 starts to pry the bowed-in J-lead into its proper position, the spacing and size of the comb teeth 42 are such that inserting comb-toothed alignment device 44 downward to the correct stop position, as FIG. 7C shows, corrects the bowed-in condition. Accordingly, as FIG. 7D illustrates, J-lead 36 is in proper alignment with J-leads 32 and 34 without the previously noted bowed-in condition.

In the preferred embodiment of the invention, the amount of bow-in correction may be adjusted by changing the depth to which comb-toothed alignment device 44 is inserted. In particular, the preferred embodiment may include a mechanism providing an adjustable height stop or other mechanism for controlling the amount of travel for comb-toothed alignment device 44.

The downward force for conditioning the J-leads may be supplied by a motor or other device. In particular, an appropriate feed mechanism may be employed with lead conditioning system 10 (FIG. 1) so that electronic device packages 30 may be automatically fed to J-lead conditioning apparatus 18. These adaptions may use known techniques of machine automation and control to achieve these purposes.

Although the invention has been described in detail herein with reference to the illustrative embodiments, it is to be understood that this description is by way of example only and is not to be construed in a limiting sense. It is to be further understood that numerous changes in the details of the embodiments of the invention and additional embodiments of the invention will be apparent to, and may be made by, persons of ordinary skill in the art having reference to this description. It is contemplated that all such changes and additional embodiments are within the spirit and true scope of the invention as claimed below.

What is claimed is:

1. A method for correcting a bowed-in condition existing on at least one J-lead of an electronic device package comprising a plurality of J-leads, the method comprising the steps of:

inserting between a bowed-in J-lead and the electronic device package a tool having a plurality of graduating thickness comb-like teeth, the graduating thickness comb-like teeth graduating from a minimum thickness to a maximum thickness, said minimum thickness for permitting the graduating thickness to be inserted into a minimal space separating the bowed-in J-lead from the electronic device package, the maximum thickness at least equaling the thickness of a desired spacing for the bowed-in lead from the electronic device package; and engaging the bowed-in J-lead with the graduating width edge of the tool for moving the bowed-in J-lead from a bowed-in position to a desired aligned position by causing the graduating thickness comb-like teeth to move along and between the electronic device package and the bowed-in J-lead for imparting a wedging force that separates the bowed-in J-lead from the electronic device package, thereby conditioning the bowed-in J-lead.

2. The method of claim 1, wherein the bowed-in J-lead is one of a plurality of leads, the plurality of leads formed adjacent to each other and another at least one side of the electronic device package, and further wherein the method comprises the step of inserting the tool between adjacent ones of the plurality of leads for performing said inserting step on at least the bowed-in lead.

3. The method of claim 1, wherein said bowed-in J-lead is one of a plurality of J-leads located along a side of the electronic device package, the plurality of leads comprising at least one properly-aligned lead, and further wherein said method comprises the step of fitting the tool between adjacent ones of the plurality of leads for performing said inserting step on at least the bowed-in lead without modifying the alignment of the properly-aligned lead.

4. The method of claim 1, further comprising the method for correcting the alignment of a plurality of bowed-in J-leads, the plurality of bowed-in J-leads comprising certain ones of a plurality of leads on the electronic device package, and further wherein the comb teeth comprise a plurality graduating-width edges, each of the packaging-width edge corresponding to adjacent ones of the plurality of leads, the method further comprising the steps of fitting said plurality of graduating thickness comb-like teeth between adjacent ones of the plurality of J-leads for performing in a single motion said inserting step for conditioning all of said plurality of bowed-in leads of the electronic device package.

5. The method of claim 1, wherein the electronic device package comprises a two-sided electronic device package and further comprising the step of conditioning all bowed-in J-leads of the two-sided electronic device package in a single motion of the comb-like teeth.

6. The method of claim 1, further comprising the step of sequentially performing said inserting step on a plurality of leads associated with a plurality of electronic device packages.

7. The method of claim 1, further comprising the step of performing said inserting step according to an automated process for correcting bowed-in leads of the electronic device package.

8. An apparatus for correcting a bowed-in condition existing on at least one lead of an electronic device package comprising a plurality of leads, comprising:

a comb-toothed alignment device comprising at least one comb-like tooth.

each of said at least one comb-like tooth comprising a graduating-width edge, said graduating width edge graduating from a minimum width to a maximum width, said minimum width for permitting the graduating width edge to be inserted into a space separating the bowed-in lead from the electronic device package, the maximum width at least equaling the width of a desired spacing for the bowed-in lead from the electronic device package; and a mechanism associated with said comb-tooth alignment device for engaging the bowed-in lead with the graduating width edge of the tool for moving the bowed-in lead from a bowed-in position to a desired aligned position by causing the graduating-width edge to move along the bowed-in end to input a wedging force that separates the bowed-in lead from the electronic device package, thereby correcting for the bowed-in-condition of the bowed-in lead.

9. The apparatus of claim 8, wherein the bowed-in lead is one of a plurality of leads, the plurality of leads formed adjacent and another along the electronic device package, and further wherein said apparatus comprises a mechanism for fitting the tool between adjacent ones of the plurality of leads for performing said inserting step on at least the bowed-in lead.

10. The apparatus of claim 8, wherein said bowed-in-lead is one of a plurality of leads located along the electronic device package, the plurality of leads comprising at least one properly-aligned lead, and further wherein said apparatus comprises a mechanism for fitting the tool between adjacent ones of the plurality of leads for performing said inserting step on at least the bowed-in lead without modifying the alignment of the properly-aligned lead.

11. The method of claim 8, further comprising the step of sequentially performing said inserting step on a plurality of leads associated with a plurality of electronic device packages.

12. The method of claim 8, further comprising the step of performing said inserting step according to an automated process for correcting bowed-in leads of the electronic device package.

* * * * *